United States Patent [19]

Hedrick

[11] 3,744,050

[45] July 3, 1973

[54] APPARATUS FOR PROVIDING AN ANALOG OUTPUT IN RESPONSE TO A DIGITAL INPUT

[75] Inventor: Geoffrey S. Hedrick, Katonah, N.Y.

[73] Assignee: Lear Siegler, Inc., Armonk, N.Y.

[22] Filed: Nov. 23, 1970

[21] Appl. No.: 92,125

[52] U.S. Cl. ...................... 340/347 DA, 340/347 SY

[51] Int. Cl. ........................................... H03k 13/02

[58] Field of Search ............... 340/347 SY, 347 DA; 235/197

[56] References Cited

UNITED STATES PATENTS

| | | | |
|---|---|---|---|
| 3,373,273 | 3/1968 | Schubert | 235/197 |
| 3,638,004 | 1/1972 | Sloane | 235/197 |
| 3,505,673 | 4/1970 | James | 340/347 DA |
| 3,582,941 | 6/1971 | La Maout | 340/347 DA |
| 3,573,793 | 4/1971 | Kihlberg | 340/347 SY |
| 3,335,417 | 8/1967 | Adler | 340/347 SY |
| 3,295,125 | 12/1966 | Idelsohn | 340/347 SY |
| 3,573,794 | 4/1971 | Widenor | 340/347 SY |
| 3,508,252 | 4/1970 | Van Blarcom | 340/347 SY |

*Primary Examiner*—Thomas A. Robinson
*Assistant Examiner*—Jeremiah Glassman
*Attorney*—Wilfred O. Schmidt and Hubbell, Cohen & Stiefel

[57] ABSTRACT

An analog output signal is provided in response to a digital input signal by means which include a read only memory which has been programmed to provide an analog function of an input signal and a binary scaling means, such as an R–2R ladder network connected to the output of the memory. The memory may be programmed to provide a sinusoidal function of the digital input signal whereby a digital-to-resolver conversion occurs and the analog resolver equivalent of the digital input is provided. Alternatively, a filter response, such as a band pass response, may be provided for an analog signal by programming the memory to provide an attenuation function in response to a digital input signal which is associated with the value of the input frequency of the analog signal, the analog signal being fed through the output stage of the memory. Clearly, the memory may be programmed for other applications in which an analog output signal is provided in response to a digital input signal.

21 Claims, 5 Drawing Figures

PATENTED JUL 3 1973 3,744,050

SHEET 1 OF 3

INVENTOR
GEOFFREY S. HEDRICK
BY Hubbell, Cohen & Stiefel
ATTORNEYS.

INVENTOR
GEOFFREY S. HEDRICK
BY Hubbell, Cohen & Stiefel
ATTORNEYS.

INVENTOR
GEOFFREY S. HEDRICK
BY Hubbell, Cohen & Stiefel
ATTORNEYS

APPARATUS FOR PROVIDING AN ANALOG OUTPUT IN RESPONSE TO A DIGITAL INPUT

BACKGROUND OF THE INVENTION

1. Field of the Invention

The present invention relates to an apparatus in which an analog output signal is provided in response to a digital input signal by means of a read-only memory means associated with binary scaling means.

2. Description of the Prior Art

Prior art devices which provide an analog output signal in response to a digital input signal are primarily of the digital-to-analog converter type. In these prior art devices, which utilize binary weighted resistor networks and associated electronic switches which alternately connect portions of the resistor network to a reference potential or to ground depending upon the state of each individual digital input, inaccuracies in the conversion result may occur due to either the impedance associated with the switches or inaccuracies in the resistors due to such factors as temperature variations. These devices provide an essentially proportional analog signal output from a digital input signal. However, where a synchro or resolver type analog output signal is desired, these devices have not proved acceptable for accomplishing the required digital-to-synchro conversion. Therefore, in order to accomplish this conversion, elaborate transformer configurations have been utilized which are bulky and cumbersome, and undesirable when weight and size of components are critical, such as in an aircraft instrument.

Prior art filter networks, such as band pass filters, utilize passive components, such as capacitors, resistors, and inductors to provide the desired filter characteristic for an analog signal. However, these passive components can only approximate an absolute pass band range due to the exponential rise and decay times associated with these elements. Therefore, there is always some residual curvature associated with the pass band characteristic so that an absolute squared or ideal filter response cannot be obtained. For many instances, an ideal filter response is not required; however, in instances when such a response is desirable or necessary, inaccuracies may result.

These prior art disadvantages are overcome by the present invention.

SUMMARY OF THE INVENTION

An apparatus is provided which provides an analog output signal in response to a digital input signal by means which include a read only memory which has been programmed to provide an analog function of an input signal and a binary scaling means, such as an R–2R ladder network connected to the output of the memory. A digital-to-synchro conversion of the digital input signal may be provided by programming the read-only memory to provide a sinusoidal function of the digital input signal, whereby the analog resolver equivalent of the digital input signal is provided. Alternatively, a filter response, such as a band pass response, may be provided for an analog signal by programming the memory to provide an attenuation function in response to a digital input signal which is associated with the value of the input frequency of the analog signal, the analog signal being fed through the output stage of the memory.

The memory, which is preferably an MOS device, may be provided either with or without a protection means. If the memory is provided with a protection means, a source of reference potential which has a value sufficient to maintain the memory in the operating state may be connected to the binary scaling means. In the alternative, in such an instance, a source of reference potential having a value such that the most positive deviation of the analog input signal will never be greater than the substrate potential may be connected to the memory. When the memory is provided without a protection means, no source of reference potential need be utilized, and the input signal is fed to the memory together with a gating signal, the output of the memory being taken from the ladder network. Clearly, the memory may be programmed for other applications in which an analog output signal is provided in response to a digital input signal, a digital-to-resolver converter and a digital filter being among the most useful of these applications.

DETAILED DESCRIPTION OF PREFERRED EMBODIMENTS

Figures 1, 2:
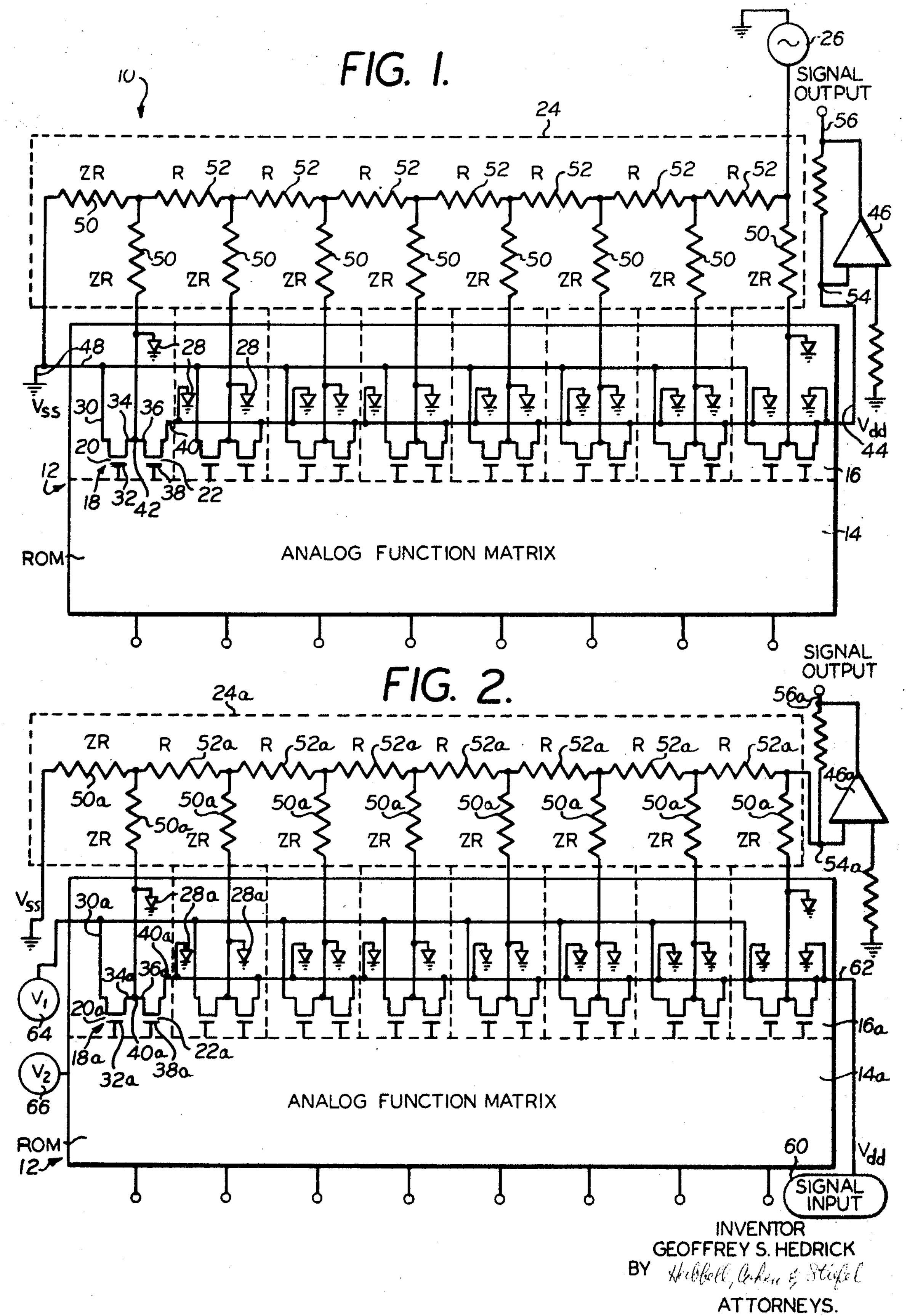
FIG. 1 is a schematic diagram, partially in block of an embodiment of a digital responsive apparatus in accordance with the present invention.
FIG. 2 is a schematic diagram, partially in block of an alternative embodiment of a digital responsive apparatus in accordance with the present invention.

Referring now to the drawings in detail and especially to FIG. 1 thereof. The embodiment of an apparatus for providing an analog output in response to a digital input, generally referred to by the reference numeral 10, which is shown in FIG. 1 and which will be described in greater detail hereinafter, is similar to the embodiment of such an apparatus shown and described in my copending patent application Ser. No. 67,543, filed Aug. 27, 1970, and entitled ALTITUDE ALERTING APPARATUS. The apparatus 10 of the present invention includes a read only memory 12, which is programmed in a conventional manner to provide an analog function in response to a digital input. The read only memory 12 is preferably constituted by a metal-oxide semi-conductor monolithic chip, which is commonly termed an MOS chip. As will be explained in greater detail hereinafter, this MOS chip 12 has an input portion 14 which is a preprogrammed function matrix which provides the desired analog function, and an output portion 16 which preferably comprises a plurality of bistable output sections 18, one for each binary input, each section comprising a pair of serially coupled sink-source field-effect transistors (FET) 20 and 22, to be described in greater detail hereinafter. The output portion 16 of the read-only memory 12 is coupled to a binary scaler, which is preferably a conventional R–2R ladder network 24. In the embodiment shown in FIG. 1, the output portion 16 of the read-only memory is also coupled to ground for a purpose to be described in greater detail hereinafter.

The ladder network 24 in the embodiment shown in FIG. 1, is preferably coupled to a source of reference potential 26 which is illustratively shown as comprising an AC source, although a DC source can be utilized. The function of reference source 26 is to maintain the read-only memory 12 in the operating condition, which is preferably the only condition in which the read-only memory 12 provides an output, diode protection devices 28 (FIG. 1) being associated with the output portion 16 as will be described in greater detail hereinafter.

Now describing the read-only memory-ladder network 12–24 in greater detail. The analog function matrix input portion 14 is a conventional matrix array program wired to provide a predetermined desired analog function, such as a sinusoidal function or an attenuation function, in response to a digital input signal and will not be described or shown in greater detail hereinafter. As was previously mentioned, the read-only memory 12 is preferably an MOS device. Such MOS devices have some fixed value resistance which can be compensated for if desired in the ladder network 24. Such compensating resistance has been omitted in FIGS. 1, 2, and 3 for purposes of clarity.

Preferably, each of the output sections 18 of the output portion 16 is identical and only one such section will be described in greater detail for purposes of explanation. As was previously mentioned, the output section 18 includes a pair of field effect transistors (FET) 20 and 22, FET transistor 20 including a source electrode 30, a gate electrode 32, and a drain electrode 34, and FET transistor 22 including a source electrode 36, a gate electrode 38 and a drain electrode 40. In addition, as was also previously mentioned, FET transistors 20 and 22 are serially connected together in sink-source relationship, with the drain electrode 34 of transistor 20 coupled to the source electrode 36 of transistor 22 at a coupling junction 42. In the embodiment shown in FIG. 1, the source electrode 30 of transistor 20 is connected to ground and the drain electrode 40 of transistor 22 is coupled via path 44 to a high gain operational amplifier 46 input. As shown and preferred in FIG. 1, the respective uncoupled source electrode 30 of each sink-source FET transistor pair 20–22 is connected in parallel to ground via path 48, and the uncoupled drain electrode 40 of each of these FET pairs 20–22 is connected in parallel to output path 44. The conventional R–2R ladder network 24 has a 2R branch, which is connected to each coupling junction 42, and an R linking branch 52 having an impedance value which is preferably approximately half the value of the 2R branch 50. The ladder network 24 is connected to ground through another 2R branch 50.

By way of illustration, in the embodiment shown in FIG. 1, diode protection devices 28 are shown as being connected in parallel to the drain electrodes 34 and 40 of each transistor pair 20–22 for protecting the MOS memory 12, and specifically the output portion 16 thereof, against voltage surges. These protection devices 28 are normally provided with read-only memories having field-effect output transistors to prevent these memories from exceeding their given rated potential at the input, although, as will be described with reference to FIG. 3, read-only memories may be provided without such diode protection devices if desired. If these diode protection devices 28 are forward biased to the point of conduction, no output will be provided from the read-only memory 12. This is termed the protection state of the memory 12. When the read-only memory 12 is in the protection state, even if a digital input is received, this input will be shorted to ground, whereby no output is provided.

In the embodiment shown in FIG. 1, the source of reference potential 26 is connected to the ladder network 24 is preferably chosen to be a value less than the forward bias potential of the protection devices 28 so that the read-only memory 12 will remain in the operating state, which is the state in which an output can be produced, for all time. Typically, the value of this reference potential for most read-only memories is 3 to 5 volts RMS for a ladder network where R is approximately 50,000 ohms and 2R is approximately 99,500 ohms. This reference potential which is fed through the ladder network 24, maintains the sources and drains of the output field effect transistors 20–22 at a potential close to the substrate voltage of the MOS memory 12 which insures that the drain-to-substrate and source-to-substrate junctions will not be forward biased, as well as preventing the protection devices 28 from being forward biased to the point of conduction.

OPERATION

For purposes of illustration, we shall describe the operation of the embodiment shown in FIG. 1 as a digital-to-synchro converter which is the use thereof described in my copending patent application Ser. No. 67,543 filed Aug. 27, 1970, and entitled ALTITUDE ALERTING APPARATUS, although the application of the apparatus of the present invention is not limited to this purpose as will be described in greater detail hereinafter. Each FET transistor pair 20–22 is an FET bistable switch with transistor 22 representing the Q state of the bistable switch and transistor 20 representing the $\overline{Q}$ state of the FET switch. When transistor 22 is ON and transistor 20 is OFF, which represents the logic 1 state, the output signal present at the junction 42 is summed into the summing junction 54 of the operational amplifier summing means 46. When transistor 20 is ON and transistor 22 is OFF, which represents the logic 0 state, the output of the transistor switch 20–22 is effectively grounded. This switching function determines which branches of the R–2R ladder network 24 are connected to the summing junction 54 and, therefore, determines the analog output of the read-only memory 12. This output signal which is present at the uncoupled drain electrodes 40 of the read-only memory 12, on path 44, is a current whose magnitude is dependent on the ladder impedance of the associated ladder network 24 and the applied reference potential from source 26.

This output signal is summed at summing junction 54 to provide an analog function output signal on path 56 which is a voltage divided output signal having a magnitude equal to the applied reference potential multiplied by the ratio of the equivalent binary scaling impedance of the binary number present at the output of the memory divided by the total impedance of the ladder network 24. The high gain amplifier summing network 46 maintains the drain potential (Vdd) substantially close to zero while accomplishing the conversion of the output signals, which are currents, to voltage signals so that the substrate will not be forward biased to the protection state. By way of example, when the analog function matrix 14 is programmed to provide a sinusoidal function such as cosine, the output voltage signal represents an analog function which is the preprogrammed sinusoidal function, such as cosine in the example given, of a binary number from the memory 12.

ALTERNATIVE EMBODIMENT

Memory With Protection Means

Referring now to FIG. 2, an alternative embodiment of the apparatus shown in FIG. 1 is shown, the same reference numerals followed by a subscript "a" being utilized to refer to similar portions thereof. The read-only memory means **12*a* of the embodiment shown in FIG. 2 is preferably identical to that previously described with reference to FIG. 1. However, no source of reference potential 26 is applied through the ladder network 24*a* to the memory 12*a*. Instead, the analog signal input, which may preferably be a reference signal of between 3 to 5 volts RMS, is applied from a signal source 60 via a parallel connection to the uncoupled drain electrode 40*a* of each of the FET transistor pairs 20*a*–22*a*. The output of the R–2R ladder network 24*a* is connected in conventional fashion to the summing junction 54*a* of the operational amplifier summing means 46*a*. The opposite end of the ladder network 24a is connected to ground via path 48*a***.

In the embodiment shown in FIG. 2, the uncoupled source electrode **30*a* is preferably connected to a source of reference potential 64, labeled "$V_1$", having, by way of example, a positive potential value of between 3 and 5 volts RMS. In addition, a second source of reference potential 66, labeled "$V_2$", which, by way of example, is preferably a negative potential such that the most positive deviation of the analog input signal is never greater than the substrate potential of the MOS memory 12*a*, is connected to the memory 12*a*. In this manner "level shifting" of the signal is accomplished to accommodate for the positive and negative voltage deviation or swing of the analog input signal so as to maintain the sources and drains of the output field effect transistors 20*a*–22*a* at a potential close to the substrate voltage of the MOS memory 12*a* which insures that the drain-to-substrate and source-to-substrate junctions will not be forward biased, as well as prevents the protection devices 28*a* from being forward biased to the point of conduction. Except for "level shifting" to accommodate for the positive and negative voltage deviations of the analog input signal, the operation of the embodiment shown in FIG. 2 is similar to that previously described with reference to the embodiment shown in FIG. 1** and will not be described in greater detail hereinafter.

ALTERNATIVE EMBODIMENT

Memory Without Protection Devices

Figures 3, 4:
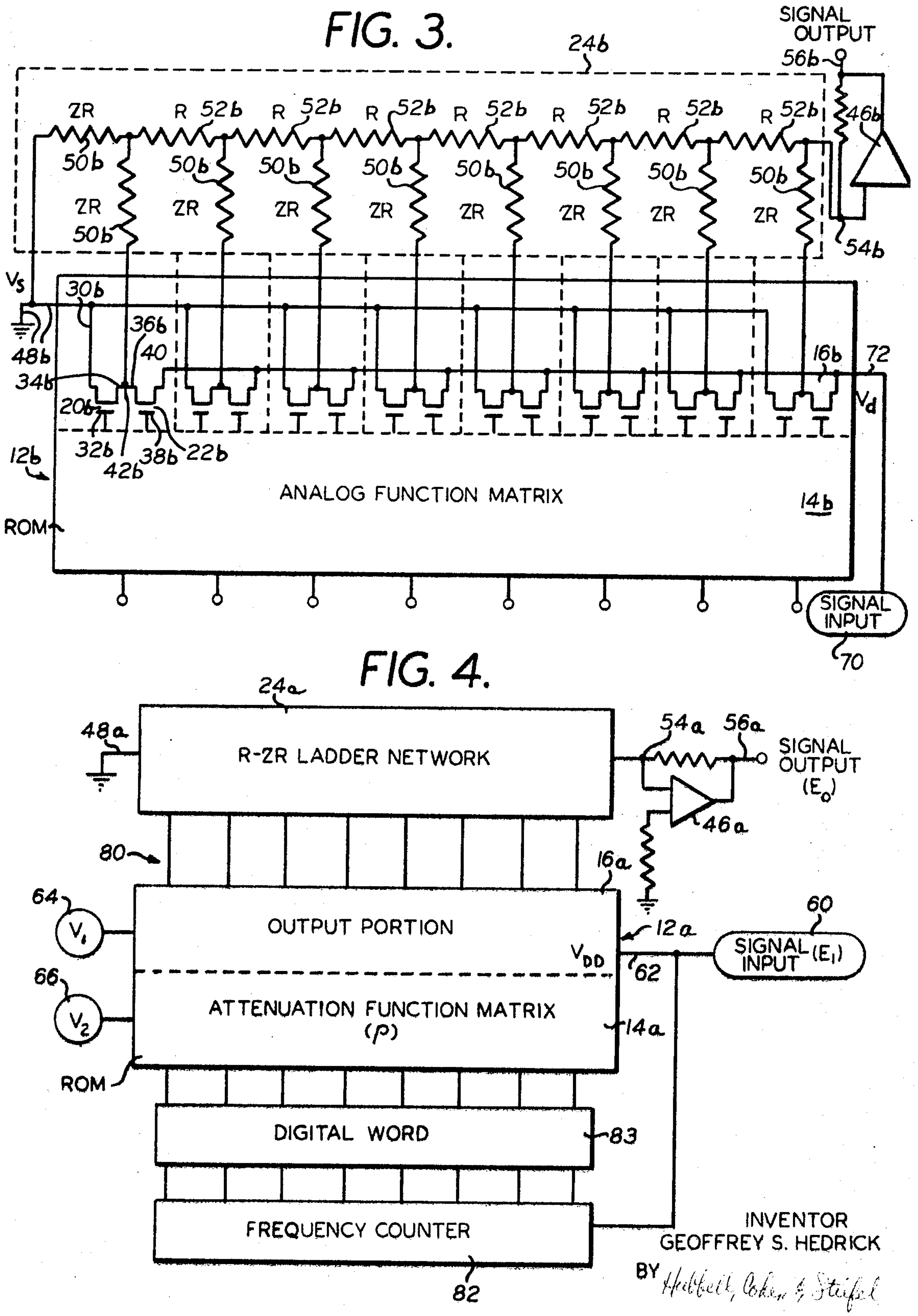
FIG. 3 is a schematic diagram, partially in block of still another alternative embodiment of a digital responsive apparatus in accordance with the present invention.
FIG. 4 is a block diagram, partially in schematic of a digital filter in accordance with the embodiment shown in FIG. 2.

Referring now to FIG. 3, an alternative embodiment of the apparatus shown in FIG. 1 is shown, the same reference numerals followed by the subscript "*b*" being utilized to refer to similar portions thereof. The read-only memory means **12*b* of the embodiment shown in FIG. 3 is preferably identical to that previously described with reference to FIG. 1 with the exception that no diode protection devices are employed. In this instance, prevention of the forward biasing of such protection devices to the point of conduction is not a consideration. The ladder network 24*b* is connected to the output portion 16*b* of the read-only memory means 12*b* in a manner similar to the connection of the ladder network 24 to the output portion 16 of the read-only memory 12 of FIG. 1 with the exception that the output of the ladder network is directly connected to summing junction 54*b* of the high gain operational amplifier 46*b*. In this embodiment, the analog input signal is supplied from a source 70 via path 72 where it is connected in parallel to the uncoupled drain electrodes 40*b* of the FET transistor pairs 20*b*–22*b*. The uncoupled source electrodes 30*b* of the FET transistor pairs 20*b*–22*b* is connected in parallel via path 48*b* to ground. The opposite end of the ladder network 24*b* from that which is connected to the summing junction 54*b* is also connected to ground. Except for the absence of the diode protection devices and the associated means for preventing these devices from being forward biased to the point of conduction, the operation of the embodiment shown in FIG. 3 is identical with that previously described with reference to the embodiment shown in FIG. 1** and will not be described in greater detail hereinafter.

Digital Filter

Referring now to the embodiment shown in FIG. 4 a preferred application of the apparatus of the present invention is shown. For purposes of illustration, a read-only memory means **12*a* and ladder network 24*a* as shown and described with reference to the embodiment shown in FIG. 2 is utilized in the digital filter apparatus, generally referred to by the reference numeral 80, shown in FIG. 4. Of course, if desired, either the embodiment shown in FIGS. 1 or 3 could be utilized in the digital filter apparatus 80** and similar results achieved. Moreover, other read-only memory-ladder network configurations than those described herein could be utilized without departing from the scope of the digital filter application of the present invention.

Now referring in greater detail to the embodiment shown in FIG. 4. The digital filter 80 which includes the read-only memory means **12*a* and the R–2R ladder network 24*a* as well as the high gain operational amplifier summing means 46*a* has the analog function matrix portion 14*a* program wired in a conventional matrix array to provide an attenuation function in response to a digital input signal. The attenuation function is preferably a linear operator for a signal similar to the functioning of a potentiometer, although other functions, including non-linear functions may be utilized. The analog input signal from source 60, which in this instance is the signal to be attenuated or filtered, is connected in parallel to the uncoupled drain electrode 40*a* of the output portion transistor pairs 20*a*–22*a* as shown in FIG. 2. In addition, the analog signal input from source 60 is connected in parallel to a means for determining the associated frequency of the analog input signal from source 60 and providing a digital word which is a function of this associated frequency as a digital input signal to the input portion 14*a* of the read-only memory means 12*a*. Any means which accomplishes this result may be utilized without departing from the scope of the digital filter 80 application of the present invention. However, in the preferred embodiment of the digital filter 80 shown in FIG. 4, this means is a conventional digital frequency counter 82 whose input is connected in parallel to the analog signal input 60 and whose output is illustratively shown as an eight parallel bit digital word which is fed to the input portion 14a of the read-only memory 12a. The balance of the circuitry of the digital filter 80 is identical with that described with reference to FIG. 2**, and will not be described in greater detail hereinafter.

Operation of Digital Filter

The operation of the read-only memory-ladder network 12a–24a combination of the digital filter 80 is identical to that described with reference to the embodiment shown in FIG. 2 with the exception that the analog function matrix is an attenuation function matrix which is responsive to the digital word input signal to control the operation of the field-effect transistor pair 201–22a switches so as to filter the analog signal input 60 and provide this filtered output as the analog signal output on path 56a. The analog signal input 60 is fed to the frequency counter 82 which converts the associated frequency of the analog signal input 60 to an eight parallel bit digital word which is the equivalent of this associated frequency. For purposes of illustration, the attenuation function is such as to provide a band-pass response for the digital filter network 80. The operation of the read-only memory 12a in accordance with the preprogrammed attenuation function is as follows.

The digital word equivalent of the frequency of the analog signal input is fed to the attenuation function matrix 14a which responds to the digital word to either provide 100 percent attenuation or some lesser degree of attenuation which in the example of a band-pass filter response is 0 percent attenuation. For the example of the band-pass filter, the attenuation function provides 100 percent attenuation in response to all digital word equivalents of frequency except for those in the pass band region for which 0 percent attenuation is provided. In this manner, the output portion 16a of the read-only memory 12a will only pass analog input signals having an associated frequency which provides 0 percent attenuation in response thereto. By providing only two levels of attenuation, either 0 percent or 100 percent, which either turns ON or OFF the FET transistor switches 20a and 22a, a squared or ideal band-pass filter response is provided from the read-only memory output portion 12a. Thereby, an analog output signal on path 56a is only provided in the pass band range of the digital filter network 80. If desired, the pass band range of the digital filter 80 may be varied merely by changing the attenuation function so as to make it responsive to different frequencies.

It should be noted that in the digital filter network 80 of the present invention, wherein the memory 12a is preprogrammed with an attenuation function, the analog input signal 60 to the read-only memory 12a is the signal to be filtered or operated on in the digital filter network 80; whereas, when the read-only memory-ladder network 12a–24a is utilized as a digital-to-synchro or resolver converter, wherein the memory 12a is prereprogrammed with a sinusoidal function, the analog signal input 60 is a reference signal.

Full Cycle Digital-to-Synchro Conversion Network

Figure 5:
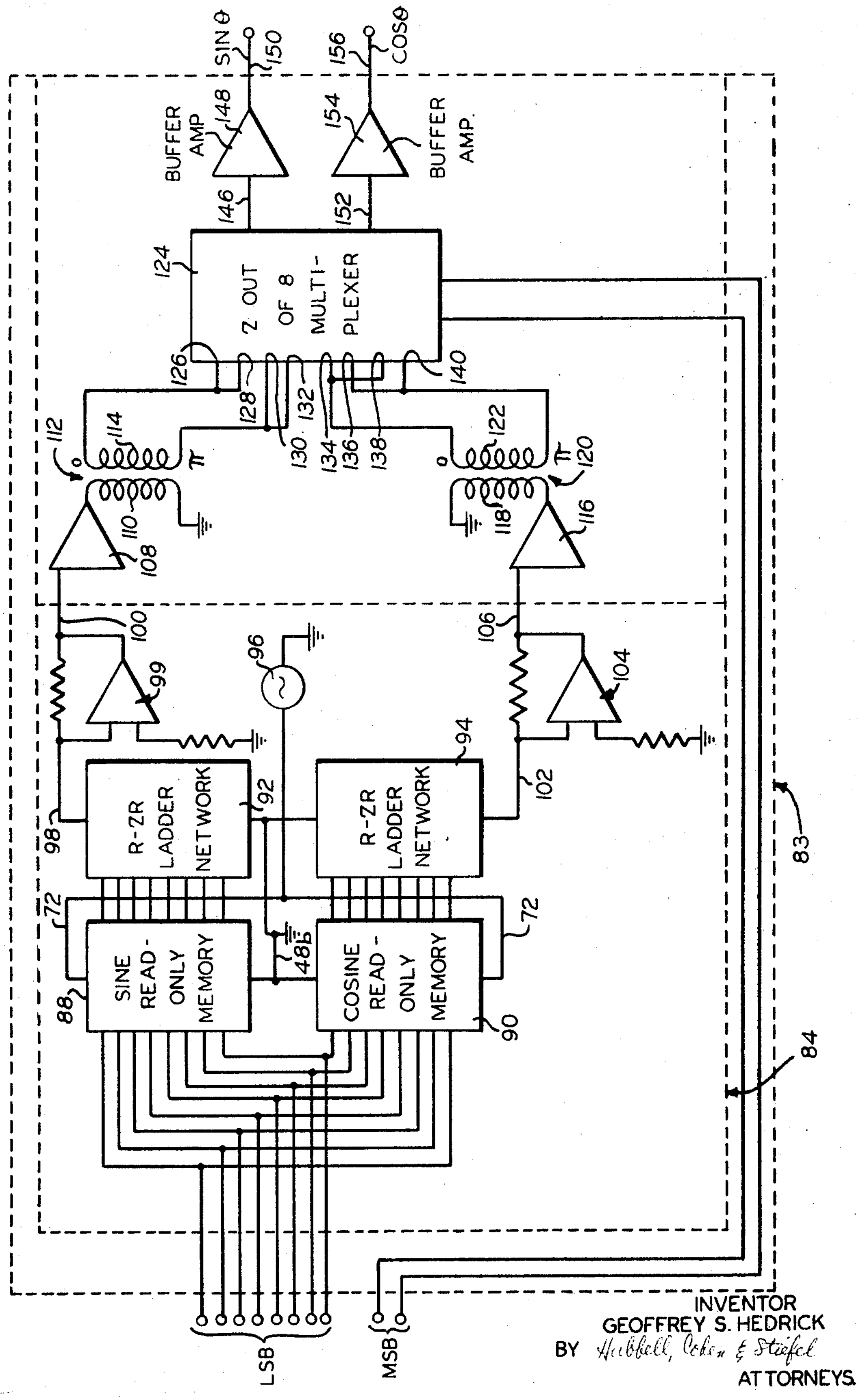
FIG. 5 is a block diagram, partially in schematic of a digital-to-resolver converter in accordance with the embodiment shown in FIG. 3.

Referring now to FIG. 5, a digital-to-synchro conversion network capable of converting, by way of example, a ten bit code, such as an ICAO altitude reporting code, which is a ten bit binary-coded decimal signal, into a pair of complimentary sinusoidal output signals, sine $\theta$ and cosine $\theta$, where $\theta$ represents the angular synchro equivalent of the digital input altitude is shown. Such a utilization of the present invention is described in my copending patent application Ser. No. 67,543, filed Aug. 27, 1970, and entitled ALTITUDE ALERTING APPARATUS, in which the digital-to-synchro conversion network comprises a digital-to-synchro quarter-cycle converter portion 84 capable of providing a pair of complimentary sinusoidal functions, which are preferably sine and cosine, respectively, of a representative synchro shaft angle between 0° and 90° from a digital input, and a full cycle quadrant selection portion 86 capable of providing the sine and cosine functions respectively, of a representative synchro shaft angle between 0° and 360° from the quarter-cycle shaft angle information and quadrant selection information. The quarter-cycle shaft angle information, in the example shown in FIG. 5, and described in my copending patent application Ser. No. 67,543, filed Aug. 27, 1970, utilizes the eight least significant bits of the ICAO code input signal to provide the quarter-cycle shaft angle information and the two most significant bits of the ICAO code signal to provide the quadrant selection information. Of course, if a full cycle digital signal without quadrant selection were utilized as the digital input, then, if desired, a full cycle converter similar in principal of operation to the preferred quarter cycle converter 84, could be utilized in place thereof, in which case the quadrant selection portion 86 would be omitted.

Preferably, the digital-to-synchro quarter-cycle converter portion 84 includes a pair of read-only memories 88 and 90, respectively, which are programmed in a conventional manner to provide a sine function of the digital input and a cosine function of the digital input, respectively. In the embodiment shown in FIG. 5, the sine read-only memory 88 and the cosine read-only memory 90 are of the type similar to the memory 12b shown and described with reference to FIG. 3 in which no diode protection devices are provided for the read-only memories 88 and 90, as opposed to the type shown and described with reference to FIG. 1, which is utilized in the embodiment described in my copending patent application Ser. No. 67,543, filed Aug. 27, 1970. Of course, if desired, any of the embodiments shown in FIGS. 1, 2 and 3 could be utilized for the read-only memory-ladder network 88–92, 90–94 configurations of the digital-to-synchro quarter-cycle converter portion 84. As was previously described, the eight least significant bit parallel digital input is coupled in parallel to eight inputs to both the sine read-only memory 88 and the cosine read-only memory 90, one input corresponding to one binary bit. The output portions 16b of both the sine read-only memory 88 and the cosine read-only memory 90 are each respectively coupled to a binary scaler, which is preferably shown as a conventional R–2R ladder network 92 and 94, similar to ladder network 24b shown in FIG. 3.

As previously described with reference to FIG. 3, the 2R branches 50b of the respective ladder networks 92 and 94 in the configuration shown in FIG. 3 are each connected to the coupling junctions 42b of the respective FET transistor pairs 20b–22b. The analog signal input, which in this instance is a reference signal, preferably in the range of 3 to 5 volts RMS, provided by a reference source 96 which is illustratively shown as an AC source, although a DC source may be utilized, is connected in parallel via path 72 to the uncoupled drain electrodes **40*b* of the FET transistor pairs 20*b*–22*b*. The uncoupled source electrodes 30*b* of the FET transistor pairs 20*b*–22*b* are connected in parallel to ground via path 48*b* as is one end of the respective ladder networks 92 and 94**.

The sine function output of the read-only memory 88 is preferably provided via path 98 to the high gain operational amplifier 99, which is similar to amplifier **46*b* in FIG. 3, which provides the quarter cycle (0° to 90°) output via a path 100, which is similar to path 56*b* in FIG. 3. Similarly, the cosine function output of the cosine read-only memory 90 is fed via a path 102, to another high gain operational amplifier 104, which is also similar to amplifier 46b in FIG. 3, which provides the quarter cycle (0° to 90°) cosine function output via a path 106, which is also similar to output path 56*b*** in FIG. 3.

The quarter cycle sine function output on path 100 and the quarter cycle cosine output on path 106 of the digital-to-synchro quarter cycle converter 84 are connected to the quadrant selection portion 86. The quarter cycle sine function output via path 100 is connected through an amplifier 108 to a primary winding 110 of a transformer 112 having a center-tapped secondary winding 114. Similarly, the quarter cycle cosine function output via path 106 is connected through an amplifier 116 to a primary winding 118 of a transformer 120 having a center-tapped secondary winding 122. The outputs of the respective secondary windings 114 and 122 are, respectively, connected to the inputs of a conventional 2-out-of-8 multiplexer 124.

The multiplexer 124 preferably has four inputs relating to the sine function 126, 128, 130, and 132, and four inputs relating to the cosine function 134, 136, 138, and 140. The multiplexer 124 also receives two quadrant select bits via path 142 and 144 from the ten bit ICAO code digital parallel input signal. Each of the inputs 126 through 140 inclusive is associated with a switch (not shown) which is enabled in accordance with the bit condition of the quadrant select bits present on the paths 142 and 144. Since the digital input of the preferred embodiment is an ICAO code input, which is a modified Gray code in which the $D_4$ bit and the $A_1$ bit are out of phase with a normal two bit binary count with respect to the third and fourth counts (normal two bit binary count is 0—0; 0-1; 1-0; 1—1; whereas Gray code two bit count is 0—0; 0-1; 1—1; and 1-0) the secondary windings 114 and 122 are connected so as to correct for this phase shift. Secondary winding 114 is in proper phase with the 0 radians output end connected in parallel to inputs 126 and 128 and the π radians output end connected in parallel to inputs 130 and 132. However, the secondary winding 122 output is normally out of proper phase and the 0 radians output end is therefore connected in parallel with inputs 134 and 138 while the π radians output end is connected in parallel with inputs 136 and 140.

The sine function output of the multiplexer 124 which is selected by switches 126 through 132 is fed via path 146 through a unity gain buffer amplifier 148 to provide a full cycle sine function output (0° to 360°) of the synchro shaft angle representative of the digital input via path 150, which function is represented by the expression sine θ, where θ represents this shaft angle. The cosine function output of the multiplexer 124 which is selected by switches 134 through 140, is fed via path 152 through a unity gain buffer amplifier 154 which provides a full cycle cosine function output (0° to 360°) of the synchro shaft angle representative of the altitude digital input via path 156, which function is represented by the expression cosine θ, where θ represents this shaft angle.

Operation of Digital-to-Synchro Conversion Network

The operation of the digital-to-synchro conversion network shown in FIG. 5, is similar to that of the digital-to-synchro converter stage of the altitude altering apparatus described in my copending application Ser. No. 67,543, filed Aug. 27, 1970, and entitled ALTITUDE ALERTING APPARATUS which is hereinafter incorporated by reference and need not be described in greater detail. Suffice it to say that the sine and cosine quarter cycle (0° to 90°) analog functions which are provided on paths 100 and 106 respectively from the read-only memory-ladder network configurations 88–92, and 90–94, respectively, are in turn fed to the multiplexer 124 via transformers 112 and 120, the sine and cosine functions being obtained in the same manner as previously described with reference to the embodiment shown in FIG. 3, the analog function matrix being preprogrammed to provide these respective functions. The sine function signal which is provided from the center-tapped secondary winding 114 is a full cycle (0° to 360°) signal, where each quadrant is represented by one of the switch inputs 124 through 132 inclusive, the proper switch 124 through 132 or quadrant being selected in accordance with the bit condition of the two bit binary quadrant select input via paths 142 and 144 [0–0 corresponding to the first quadrant (0° to 90°); 0–1 corresponding to the second quadrant (90° to 180°); 1–0 corresponding to the third quadrant (180° to 270°); and 1—1 corresponding to the fourth quadrant (270° to 360°)].

Similarly, for the cosine function signal present at the primary winding 118 which is fed to the center-tapped secondary winding 122 of the transformer 120, where the proper quadrant is selected by selecting the correct switch 134 to 140 inclusive in accordance with the bit condition of the quadrant select bits 142 and 144. The quadrant select bits 142 and 144 are fed in parallel to the sine select switch group 126 through 132 and the cosine select switch group 134 through 140 so that the sine and cosine functions present on paths 146 and 152 are functions of the same full cycle angle which is the synchro equivalent of the digital input. These two outputs are fed through inverting-non-inverting buffer amplifiers 148 and 154, respectively, to provide the sinusoidal functions sine θ and cosine θ which represent the synchro shaft angle equivalent of the digital input signal. In this manner a full cycle (0° to 360°) conversion of a digital signal to a synchro shaft angle equivalent may be achieved by using read-only memories which have been preprogrammed to provide only a quarter cycle (0° to 90°) digital-to-synchro conversion.

By utilizing the apparatus of the present invention either a digital-to-synchro conversion or a digital filtering for an analog signal may be provided in a simple and efficient manner, as well as any other analog output in response to a digital input. Although the most useful applications of the present invention are in a digital-to-synchro converter and a digital filter, in which a squared or ideal filter response may be provided, other applications of the present invention will occur to those of ordinary skill in the art.

It is to be understood that the above described embodiments of the invention are merely illustrative of the principles thereof and that numerous modifications and embodiments of the invention may be derived within the spirit and scope thereof.

What is claimed is:

1. An apparatus for providing an analog output signal in response to a digital input signal comprising:

a read only memory means having an input portion and an output portion, said digital signal being a binary signal whose content comprises a plurality of bits, said plurality of bits being fed to said input portion, said input portion comprising a preprogrammed matrix array programmed to provide an analog function in response to said digital input signal, said output portion comprising a plurality of bistable switching means, one bistable switching means being provided for each of said bits, each of said bistable switching means including a serially coupled sink-source pair of field effect transistors, each having a source electrode, a drain electrode and a gate electrode with the source electrode of one transistor of said transistor pair being coupled at a junction to the drain electrode of the other transistor of said transistor pair;

binary scaling means operatively connected to said memory means output portion, said scaling means comprising a ladder network having a plurality of branches, each of said branches being operatively connected to an associated one of said junction points for scaling said digital binary input to provide said analog output in accordance with said analog function, each of said bistable switching means having an output state in which an output signal is provided to said associated ladder network branch and another state in which an output signal is not provided to said associated branch, said analog output being dependent on the state of each of said bistable switching means, said state being dependent on said function and said binary signal content; and summing means operatively associated with said scaling means branches for providing said analog output from a sum of the outputs of said branches to which an output signal has been provided.

2. An apparatus in accordance with claim 1 wherein said apparatus further includes a source of analog input signal, said analog input signal having an associated frequency, said analog input source being operatively connected to said output portion for applying said analog input signal thereto, said analog function is an attenuation function, said digital input signal is a function of said associated frequency, and said output portion provides said analog output signal in accordance with said analog input signal and said attenuation function, whereby said analog input signal is filtered.

3. An apparatus in accordance with claim 2 wherein said apparatus includes a means operatively connected to said analog input source and said memory means input portion for providing said digital input signal to said memory means input portion as a function of said associated frequency.

4. An apparatus in accordance with claim 3 wherein said digital input providing means includes means for determining said associated frequency and providing a digital equivalent of said associated frequency as said digital input.

5. An apparatus in accordance with claim 2 wherein said analog input is applied to said uncoupled drain electrode.

6. An apparatus in accordance with claim 5 wherein said summing means has an input and an output, said summing means input being operatively connected to said scaling means for providing said filtered analog output therefrom.

7. An apparatus in accordance with claim 2 wherein said binary scaling means is an R–2R impedance ladder network.

8. An apparatus in accordance with claim 1 wherein said binary scaling means is an R–2R impedance ladder network.

9. An apparatus in accordance with claim 1 wherein said memory means has an operating state and a protection state, no output being provided from said output portion in said protection state, said memory means output portion being capable of providing said analog output in said operating state.

10. An apparatus in accordance with claim 9 further comprising means for maintaining said memory means in said operating state, said maintaining means being operatively connected to said memory means.

11. An apparatus in accordance with claim 10 wherein a source of an analog input signal having a most positive deviation is operatively connected to said output portion for feeding said analog input signal thereto, said memory means is an MOS memory means having a substrate and an associated substrate potential, and said maintaining means includes means for referencing said analog input signal at a potential of a value such that said most positive deviation of said analog input signal is never greater than said associated substrate potential, whereby said MOS means is maintained in said operating state.

12. An apparatus in accordance with claim 11 wherein said analog input signal has an associated frequency, said analog function is an attenuation function, said digital input signal is a function of said associated frequency, and said output portion provides said analog output signal in accordance with said analog input signal and said attenuation function, whereby said analog input signal is filtered.

13. An apparatus in accordance with claim 10 wherein said memory means includes a protection means having a conduction state and a non-conduction state, said protection means being operatively connected to said output portion, said memory means being in said operating state when said protection means is in said non-conduction state and in said protection state when said protection means is in said conduction state, said maintaining means maintaining said protection means in said non-conduction state.

14. An apparatus in accordance with claim 1 wherein said scaling means comprises an impedance means, said analog output signal has a magnitude proportional to said scaling means impedance.

15. An apparatus in accordance with claim 11 wherein said summing means has an input and an output, said summing means input being operatively connected to said scaling means, said scaling means having a total impedance value and a scaled impedance value equivalent to a binary equivalent of said digital input, said summing means output being said analog output, said summing means output having a magnitude proportional to said reference potential and a ratio of said scaling means scaled impedance to said scaling means total impedance.

16. An apparatus in accordance with claim 11 wherein said summing means has an input and an output, said summing means input being operatively connected to said memory means output portion, said scaling means having a total impedance value and a scaled impedance value equivalent to a binary equivalent of said digital input, said summing means output being said analog output, said summing output having a magnitude proportional to said reference potential and a ratio of said scaling means scaled impedance to said scaling means total impedance, said summing means being a high gain operational amplifier means, said memory means is an MOS memory means having a substrate and an associated substrate potential, said summing means input being operatively connected to said scaling means, and said reference potential maintaining said uncoupled source and drain electrodes at a potential close to substrate potential, whereby said MOS means is maintained in said operating state.

17. An apparatus in accordance with claim 1 wherein said input portion is programmed to provide a sinusoidal function of said digital input signal, said analog output signal being a synchro output signal proportional to said digital input signal.

18. An apparatus in accordance with claim 17 wherein said plurality of bits includes digital angular information bits and quadrant location bits, said angular information bits indicating a digital angular equivalent between 0° and 90° and said quadrant location bits indicating a quadrant of 360° in which said equivalent digital angle is located, said apparatus further including means for providing said synchro output signal as an analog sinusoidal function of a digital angle between 0° and 360° from said angular information and said quadrant location bits.

19. An apparatus in accordance with claim 18 wherein said read only memory means input portion is programmed to provide said analog sinusoidal function as a function of a digital angle between 0° and 90°, and said analog 0° to 360° analog sinusoidal function providing means includes multiplexer switching means operatively connected to said binary scaling means and said digital input for providing said 0° to 360° analog function from said sinusoidal function of a digital angle between 0° and 90° and said quadrant location bits.

20. An apparatus in accordance with claim 19 wherein said 0° to 360° analog sinusoidal function providing means includes a transformer means having a center-tapped secondary winding and a primary winding, said primary winding being operatively connected to an input of said multiplexer and to said binary scaling means for providing said 0° and 90° sinusoidal function as an input to said multiplexer.

21. An apparatus in accordance with claim 2 wherein said attenuation function is a non-linear function.

* * * * *